US012029098B2

(12) United States Patent
Gong et al.

(10) Patent No.: US 12,029,098 B2
(45) Date of Patent: Jul. 2, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Wenliang Gong, Wuhan (CN); Guochao Wang, Wuhan (CN)

(73) Assignee: WUHAN CHINA STAR OPTOELECTRONICS SEMICONDUCTR DISPLAY TECHNOLOGY CO., LTD, Wuhan (CN)

( * ) Notice: Subject to any disclaimer, the term of this patent is extended or adjusted under 35 U.S.C. 154(b) by 440 days.

(21) Appl. No.: 17/419,699

(22) PCT Filed: Apr. 30, 2021

(86) PCT No.: PCT/CN2021/091359
§ 371 (c)(1),
(2) Date: Jun. 29, 2021

(87) PCT Pub. No.: WO2022/198753
PCT Pub. Date: Sep. 29, 2022

(65) Prior Publication Data
US 2023/0157138 A1    May 18, 2023

(30) Foreign Application Priority Data
Mar. 26, 2021   (CN) .......................... 202110326397.3

(51) Int. Cl.
*H10K 59/80*    (2023.01)
*H10K 59/12*    (2023.01)
*H10K 59/40*    (2023.01)

(52) U.S. Cl.
CPC ......... *H10K 59/8792* (2023.02); *H10K 59/12* (2023.02); *H10K 59/40* (2023.02)

(58) Field of Classification Search
CPC .... H10K 59/8792; H10K 59/12; H10K 59/40; H10K 59/38; H10K 50/858
See application file for complete search history.

(56) References Cited

U.S. PATENT DOCUMENTS

| 2007/0164193 A1 | 7/2007 | Lee |
| 2014/0185129 A1 | 7/2014 | Kim et al. |

(Continued)

FOREIGN PATENT DOCUMENTS

| CN | 203164460 U | 8/2013 |
| CN | 104375314 A | 2/2015 |

(Continued)

OTHER PUBLICATIONS

International Search Report in International application No. PCT/CN2021/091359,dated Dec. 23, 2021.

(Continued)

*Primary Examiner* — Syed I Gheyas
(74) *Attorney, Agent, or Firm* — PV IP PC; Wei Te Chung; Zhigang Ma (57) ABSTRACT

A display panel and a display device are disclosed. The display panel includes a light-emitting functional layer and a color filter layer, and the light-emitting functional layer includes a plurality of pixel light-emitting units disposed at intervals. In a first display area, the color filter layer includes a first light-filtering layer and a first transparent planarization layer, the first light-filtering layer includes at least two first light-filtering units corresponding to the pixel light-emitting units by one to one, and the first transparent planarization layer fills gaps among the first light-filtering units adjacent to each other.

18 Claims, 2 Drawing Sheets

(56) References Cited

U.S. PATENT DOCUMENTS

| | | | |
|---|---|---|---|
| 2019/0123278 A1* | 4/2019 | Zou | H10K 77/111 |
| 2021/0167144 A1* | 6/2021 | Lim | H10K 59/122 |

FOREIGN PATENT DOCUMENTS

| | | | |
|---|---|---|---|
| CN | 105159514 A | | 12/2015 |
| CN | 107491211 A | | 12/2017 |
| CN | 107887418 A | | 4/2018 |
| CN | 108881530 A | | 11/2018 |
| CN | 108922900 A | | 11/2018 |
| CN | 108983487 A | | 12/2018 |
| CN | 109068044 A | | 12/2018 |
| CN | 109119453 A | | 1/2019 |
| CN | 109755282 A | | 5/2019 |
| CN | 109755285 A | | 5/2019 |
| CN | 109817109 A | | 5/2019 |
| CN | 110061038 A | | 7/2019 |
| CN | 110096177 A | | 8/2019 |
| CN | 110518135 A | | 11/2019 |
| CN | 110543050 A | | 11/2019 |
| CN | 110676301 A | | 1/2020 |
| CN | 110989866 A | | 4/2020 |
| CN | 111048688 A | | 4/2020 |
| CN | 111062077 A | | 4/2020 |
| CN | 111063709 A | | 4/2020 |
| CN | 111081752 A | | 4/2020 |
| CN | 111312072 A | | 6/2020 |
| CN | 111370441 A | | 7/2020 |
| CN | 111384284 A | | 7/2020 |
| CN | 111554829 A | | 8/2020 |
| CN | 111563434 A | | 8/2020 |
| CN | 111668240 A | | 9/2020 |
| CN | 111682048 A | | 9/2020 |
| CN | 111682052 A | | 9/2020 |
| CN | 111799311 A | | 10/2020 |
| CN | 112054044 A | | 12/2020 |
| CN | 112130371 A | | 12/2020 |
| CN | 112130691 A | | 12/2020 |
| CN | 112164764 A | | 1/2021 |
| CN | 112201683 A | | 1/2021 |
| CN | 112259584 A | | 1/2021 |
| CN | 112366221 A | | 2/2021 |
| CN | 112415805 A | | 2/2021 |
| CN | 109994047 B | * | 10/2021 |
| JP | 2005293946 A | | 10/2005 |

OTHER PUBLICATIONS

Written Opinion of the International Search Authority in International application No. PCT/CN2021/091359, dated Dec. 23, 2021.

Chinese Office Action issued in corresponding Chinese Patent Application No. 202110326397.3 dated Jul. 5, 2022, pp. 1-12.

Chinese Office Action issued in corresponding Chinese Patent Application No. 202110326397.3 dated Oct. 10, 2022, pp. 1-5.

Chinese Office Action issued in corresponding Chinese Patent Application No. 202110326397.3 dated Mar. 30, 2023, pp. 1-10.

* cited by examiner

DISPLAY PANEL AND DISPLAY DEVICE

RELATED APPLICATIONS

This application is a Notional Phase of PCT Patent Application No. PCT/CN2021/091359 having international filing date of Apr. 30, 2021, which claims the benefit of priority of Chinese Patent Application No. 202110326397.3 filed on Mar. 26, 2021. The contents of the above applications are all incorporated by reference as if fully set forth herein in their entirety.

FIELD OF INVENTION

The present disclosure relates to the field of display technologies, and more particularly, to a display panel and a display device.

BACKGROUND OF INVENTION

With development of full screen display technologies, camera-under-panel (CUP) technology has been continuously iterating from an initial concept to current mass production. A key factor of the camera-under-panel technology is to improve transmittances to visible light in camera areas of display panels. However, subjected to current panel designs and film structures, the transmittances in the camera areas of the display panels are not high. Therefore, it is necessary to introduce new designs, materials, and processes for improving the transmittances in the camera areas of the display panels, thereby improving an image-taking effect of under-screen cameras.

Technical problem: an embodiment of the present disclosure provides a display panel and a display device, which can improve a transmittance in a camera area of the display panel, thereby improving the image-taking effect of the under-screen cameras.

SUMMARY OF INVENTION

An embodiment of the present disclosure provides a display panel, which includes a first display area and a second display area, wherein, a light transmittance of the first display area is greater than a light transmittance of the second display area; the display panel includes a light-emitting functional layer and a color filter layer, and the light-emitting functional layer includes a plurality of pixel light-emitting units disposed at intervals; and in the first display area, the color filter layer includes a first light-filtering layer and a first transparent planarization layer, the first light-filtering layer includes a plurality of first light-filtering units corresponding to the pixel light-emitting units by one to one, and the first transparent planarization layer fills gaps among the first light-filtering units adjacent to each other.

Optionally, in some embodiments of the present disclosure, in the second display area, the color filter layer includes a black matrix layer, a second light-filtering layer, and a second transparent planarization layer, the black matrix layer is patterned to form black matrix openings, the second light-filtering layer includes a plurality of second light-filtering units disposed in the black matrix openings and corresponding to the pixel light-emitting units by one to one, and the second transparent planarization layer covers the second light-filtering layer and the black matrix layer.

Optionally, in some embodiments of the present disclosure, an orthographic projection of the first light-filtering units on the light-emitting functional layer covers the pixel light-emitting units corresponding to the first light-filtering units, and an orthographic projection of the second light-filtering units on the light-emitting functional layer covers the pixel light-emitting units corresponding to the second light-filtering units.

Optionally, in some embodiments of the present disclosure, for the pixel light-emitting units having a same color, a size of the pixel light-emitting units in the first display area is less than a size of the pixel light-emitting units in the second display area, and for the first light-filtering units and the second light-filtering units corresponding to the pixel light-emitting units having the same color, a size of the first light-filtering units is less than a size of the second light-filtering units.

Optionally, in some embodiments of the present disclosure, the light-emitting functional layer includes a first electrode layer, a light-emitting layer, and a second electrode layer, the light-emitting layer is disposed between the first electrode layer and the second electrode layer, the first electrode layer includes a plurality of first electrodes disposed at intervals and independent of each other, and the first electrodes correspond to the pixel light-emitting units; and in the first display area, openings of the second electrode layer are defined on the second electrode layer corresponding to the gaps among the first light-filtering units.

Optionally, in some embodiments of the present disclosure, a projection of the openings of the second electrode layer on the color filter layer is within a plane range of the gaps among the first light-filtering units.

Optionally, in some embodiments of the present disclosure, in the second display area, the second electrode layer is disposed as a whole layer.

Optionally, in some embodiments of the present disclosure, the display panel further includes a touch control layer disposed between the color filter layer and the light-emitting functional layer, and the touch control layer includes touch control electrodes disposed in an area outside the first display area.

Optionally, in some embodiments of the present disclosure, in the second display area, the touch control electrodes are disposed at positions corresponding to the black matrix layer.

Optionally, in some embodiments of the present disclosure, the display panel further includes a coverplate disposed on one side of the color filter layer away from the light-emitting functional layer, and in the first display area, the coverplate includes a transparent substrate and an anti-reflection film disposed on one side of the transparent substrate away from the color filter layer.

Optionally, in some embodiments of the present disclosure, the anti-reflection film includes a transparent film layer having a single-layered structure or a multi-layered transparent film layer having different refractive indexes.

Optionally, in some embodiments of the present disclosure, the anti-reflection film includes a single-layered magnesium fluoride thin film, a double-layered magnesium fluoride/zirconia thin film, or a multi-layered silicon oxide/titanium oxide/silicon oxide/titanium oxide thin film.

Optionally, in some embodiments of the present disclosure, the display panel further includes an array substrate, the array substrate includes a substrate, and in the first display area, the substrate is a transparent substrate.

Optionally, in some embodiments of the present disclosure, the transparent substrate is highly transparent glass or a transparent polyimide thin film.

Correspondingly, an embodiment of the present disclosure further provides a display device, which includes a display panel, wherein, the display panel includes a first display area and a second display area, and a light transmittance of the first display area is greater than a light transmittance of the second display area; the display panel includes a light-emitting functional layer and a color filter layer, and the light-emitting functional layer includes a plurality of pixel light-emitting units disposed at intervals; and in the first display area, the color filter layer includes a first light-filtering layer and a first transparent planarization layer, the first light-filtering layer includes a plurality of first light-filtering units corresponding to the pixel light-emitting units by one to one, and the first transparent planarization layer fills gaps among the first light-filtering units adjacent to each other.

Optionally, in some embodiments of the present disclosure, in the second display area, the color filter layer includes a black matrix layer, a second light-filtering layer, and a second transparent planarization layer, the black matrix layer is patterned to form black matrix openings, the second light-filtering layer includes a plurality of second light-filtering units disposed in the black matrix openings and corresponding to the pixel light-emitting units by one to one, and the second transparent planarization layer covers the second light-filtering layer and the black matrix layer.

Optionally, in some embodiments of the present disclosure, the light-emitting functional layer includes a first electrode layer, a light-emitting layer, and a second electrode layer, the light-emitting layer is disposed between the first electrode layer and the second electrode layer, the first electrode layer includes a plurality of first electrodes disposed at intervals and independent of each other, and the first electrodes correspond to the pixel light-emitting units; and in the first display area, openings of the second electrode layer are defined on the second electrode layer corresponding to the gaps among the first light-filtering units.

Optionally, in some embodiments of the present disclosure, the display panel further includes a touch control layer disposed between the color filter layer and the light-emitting functional layer, and the touch control layer includes touch control electrodes disposed in an area outside the first display area.

Optionally, in some embodiments of the present disclosure, the display panel further includes a coverplate disposed on one side of the color filter layer away from the light-emitting functional layer, and in the first display area, the coverplate includes a transparent substrate and an anti-reflection film disposed on one side of the transparent substrate away from the color filter layer.

Optionally, in some embodiments of the present disclosure, the display panel further includes an array substrate, the array substrate includes a substrate, and in the first display area, the substrate is a transparent substrate.

Beneficial effect: the embodiments of the present disclosure provide the display panel and the display device. The display panel includes the first display area and the second display area, wherein, the light transmittance of the first display area is greater than the light transmittance of the second display area. The display panel includes the light-emitting functional layer and the color filter layer, and the light-emitting functional layer includes the plurality of pixel light-emitting units disposed at intervals. In the first display area, the color filter layer includes the first light-filtering layer and the first transparent planarization layer, the first light-filtering layer includes the plurality of first light-filtering units corresponding to the pixel light-emitting units by one to one, and the first transparent planarization layer fills the gaps among the first light-filtering units adjacent to each other. The present disclosure disposes the color filter layer on the light-emitting functional layer of the display panel to replace polarizers, and in the first display area, the gaps among the first light-filtering units in the color filter layer are filled only by the transparent planarization layer. Therefore, the light transmittance of the first display area of the display panel is improved, thereby improving an image-taking effect of cameras.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

The embodiments of the present disclosure provide a display panel and a display device to improve a light transmittance in a camera area of the display panel, thereby improving an image-taking effect of under-screen cameras. They will be described in detail in the following. It should be noted that an order of description in the following embodiments is not meant to limit a preferred order of the embodiments.

Figure 1:
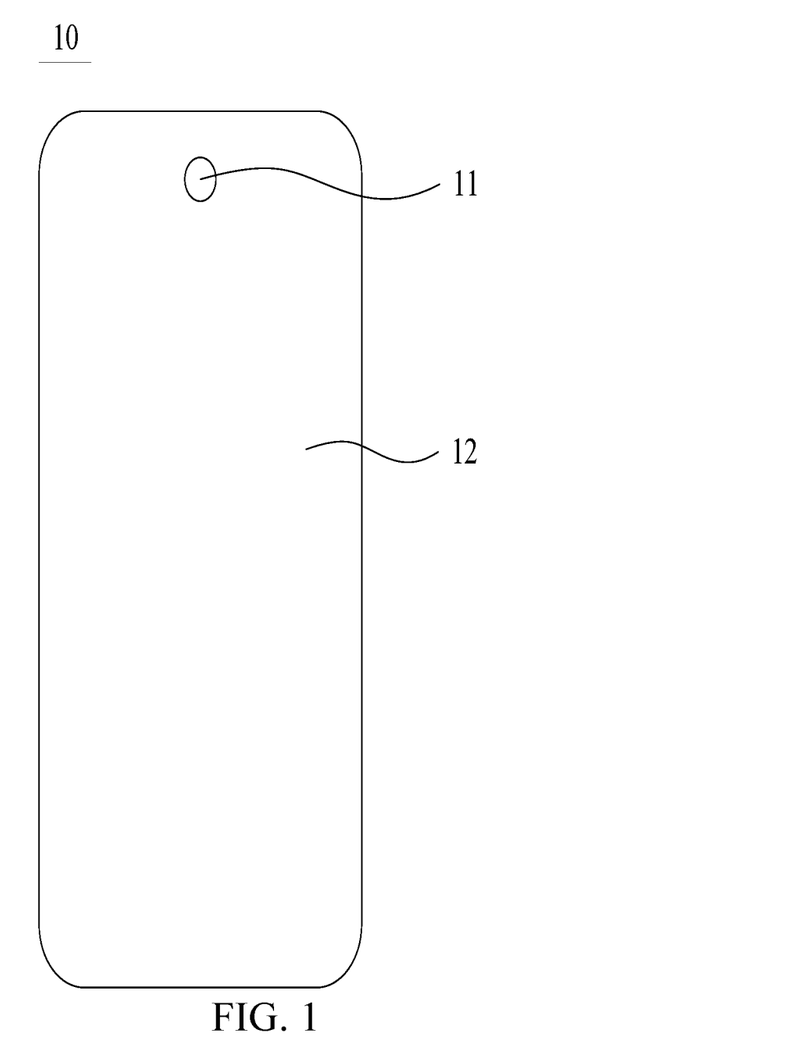
FIG. 1 is a schematic planar structural diagram of a display panel according to an embodiment of the present disclosure.
Figure 2:
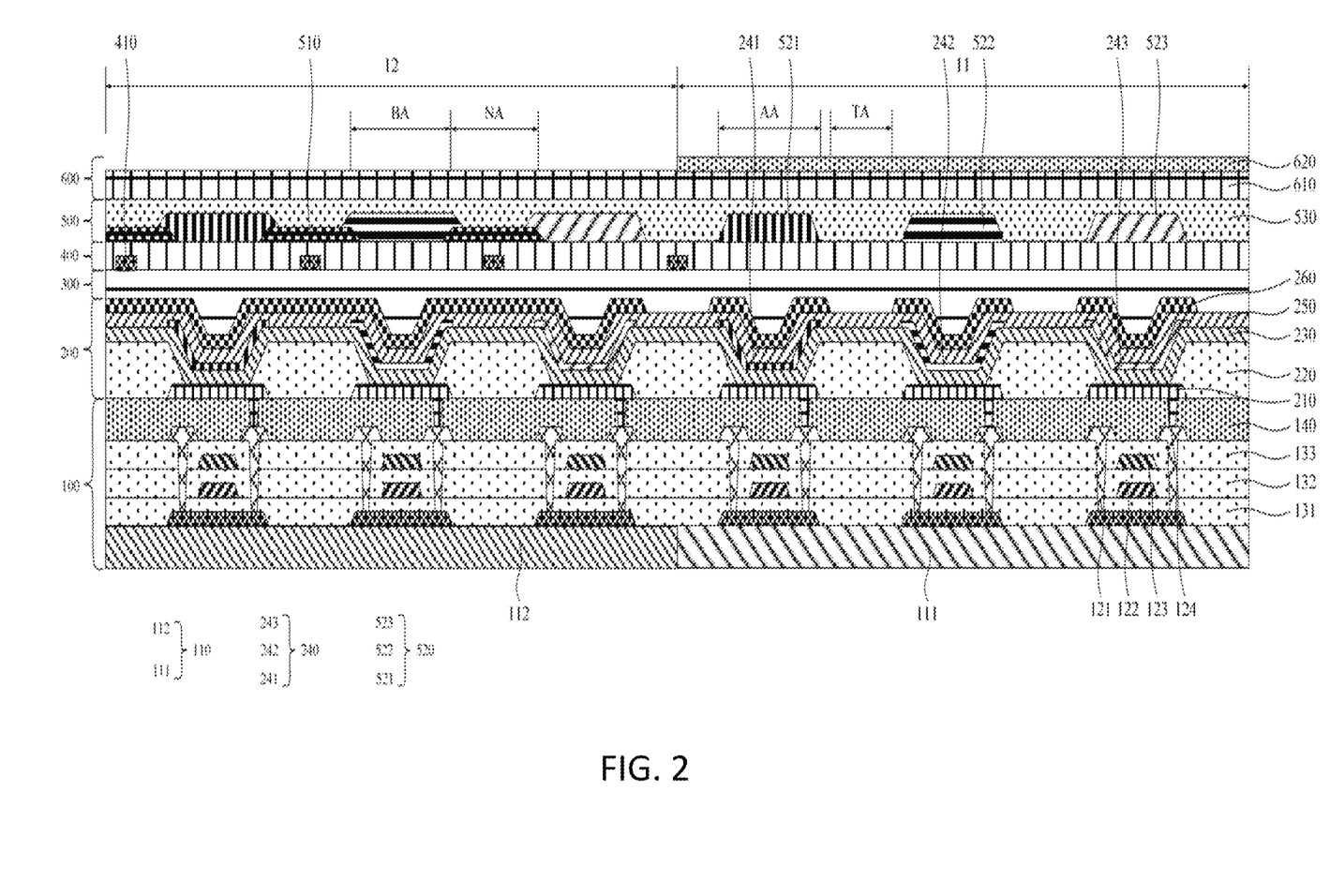
FIG. 2 is a schematic cross-sectional structural diagram of the display panel according to an embodiment of the present disclosure.

In an embodiment, referring to FIGS. 1 and 2, FIG. 1 shows a schematic planar structural diagram of the display panel provided by the present disclosure, and FIG. 2 shows a schematic cross-sectional structural diagram of the display panel provided by the present disclosure. As shown in the figures, the display panel 10 provided by the embodiment of the present disclosure includes a first display area 11 and a second display area 12, and a light transmittance of the first display area 11 is greater than a light transmittance of the second display area 12. In the first display area 11, the display panel includes first pixel areas AA and light-transmitting areas TA disposed between the first pixel areas AA, and in the second display area 12, the display panel includes second pixel areas BA and light-shielding areas NA disposed between the second pixel areas BA. The display panel includes a light-emitting functional layer 200 and a color filter layer 500. The light-emitting functional layer 200 includes a plurality of pixel light-emitting units disposed at intervals, and the pixel light-emitting units are positioned in corresponding first pixel areas AA and second pixel areas BA by one to one. The color filter layer 500 is disposed on a light-emitting side of the light-emitting functional layer 200 and includes a black matrix layer 510, a light-filtering layer 520, and a transparent planarization layer 530.

The black matrix layer 510 is disposed only in the second display area 12, that is, no black matrix layer is disposed in the first display area 11. In the second display area 12, the black matrix layer 510 is patterned to form black matrix openings, the black matrix openings correspond to the pixel light-emitting units by one to one, and the black matrix layer 510 excluding the black matrix openings covers the light-shielding areas NA. The black matrix layer 510 is mainly configured to absorb light to reduce reflections of metals under the black matrix layer 510 to external light, thereby reducing a low blue light effect of the display panel. A material of the black matrix layer 510 includes at least one of carbon black, titanium oxide, inks, or photoresists with dark colors.

The light-filtering layer 520 is disposed on the black matrix layer 510 and includes light-filtering units 521, light-filtering units 522, and light-filtering units 523 disposed at intervals, and the light-filtering units 521, the light-filtering units 522, and the light-filtering units 523 may be red light-filtering units, green light-filtering units, and blue light-filtering units, respectively. In the second display area 12, the light-filtering units 521, the light-filtering units 522, and the light-filtering units 523 are disposed in different black matrix openings, respectively. The red light-filtering units correspond to red pixel light-emitting units by one to one, the green light-filtering units correspond to green pixel light-emitting units by one to one, and the blue light-filtering units correspond to blue pixel light-emitting units by one to one. Similarly, in the first display area 11, the light-filtering units 521, the light-filtering units 522, and the light-filtering units 523 are disposed independently at intervals, respectively. The red light-filtering units correspond to the red pixel light-emitting units by one to one, the green light-filtering units correspond to the green pixel light-emitting units by one to one, and the blue light-filtering units correspond to the blue pixel light-emitting units by one to one. In an embodiment, for the pixel light-emitting units having a same color, a size of the pixel light-emitting units in the first display area 11 is less than a size of the pixel light-emitting units in the second display area 12, and for the light-filtering units corresponding to the pixel light-emitting units having the same color, a size of the light-filtering units in the first display area 11 is less than a size of the light-filtering units in the second display area 12. An orthographic projection of the light-filtering units on the light-emitting functional layer covers corresponding pixel light-emitting units, and the size of the light-filtering units may be same as or larger than the corresponding pixel light-emitting units. The light-filtering units may be disposed only in corresponding pixel areas or may cover and extend out of the corresponding pixel areas. Each of the light-filtering units in the light-filtering layer 520 may include materials corresponding to colors thereof, such as pigments, photo curable resins, alkaline soluble resins, photo initiators, to realize light filtering functions.

The transparent planarization layer 530 is disposed on the light-filtering layer 520. In the second display area 12, the transparent planarization layer 530 covers the light-filtering layer 520 and the black matrix layer 510, and in the first display area 11, the transparent planarization layer 530 covers the light-filtering layer 520 and fills gaps among the light-filtering units 521, the light-filtering units 522, and the light-filtering units 523. A material of the transparent planarization layer 530 mainly includes acrylic organic materials and siloxane organic materials, and specifically includes, but is not limited to, acrylates, polyimide (PI), or benzocyclobutene (BCB).

The embodiment of the present disclosure reduces a thickness of the display panel by disposing the color filter layer on the light-emitting functional layer of the display panel to replace polarizers, and prevents the black matrix layer from shielding light that is transmitted through the light-transmitting areas by adopting a transparent filling layer to fill the gaps among the light-filtering units, thereby improving the light transmittance in the first display area of the display panel and improving the image-taking effect of the under-screen cameras.

Specifically, referring to FIG. 2, the display panel provided by the embodiment of the present disclosure includes an array substrate 100, the light-emitting functional layer 200, an encapsulation layer 300, a touch control layer 400, the color filter layer 500, and a coverplate 600 disposed in a stack from bottom to top.

Wherein, the array substrate 100 includes a substrate 110, a semiconductor active layer 121, a first insulating layer 131, a first gate electrode layer 122, a second insulating layer 132, a second gate electrode layer 123, a third insulating layer 133, a source and drain electrode layer 124, and a planarization layer 140 disposed in sequence from bottom to top. Wherein, the semiconductor active layer 121, the first gate electrode layer 122, the second gate electrode layer 123, and the source and drain electrode layer 124 together form components such as thin film transistors and capacitors of the display panel. The semiconductor active layer 121 is patterned to form active areas of the thin film transistors, and the active areas include channel areas and doped areas disposed on both sides of the channel areas. A material of the semiconductor active layer 121 may be oxide semiconductor materials, polysilicon materials, or monocrystalline silicon materials, and is not limited herein. The first gate electrode layer 122 is patterned to form first gate electrodes of the thin film transistors and first electrode plates of the capacitors. The second gate electrode layer 123 is patterned to form second gate electrodes of the thin film transistors and second electrode plates of the capacitors. The first gate electrodes and the second gate electrodes correspond to the channel areas of the semiconductor active layer 121 at a same time. The source and drain electrode layer 124 is patterned to form source electrodes and drain electrodes of the thin film transistors, and the source electrodes and the drain electrodes are connected to the doped areas on both sides of the channel areas by penetrating through through-holes of the first insulating layer 131, the second insulating layer 132, and the third insulating layer 133. The components, such as the thin film transistors and the capacitors, and signal lines of the array substrate together constitute driving circuits of the display panel 10 to drive the light-emitting functional layer 200 to emit light and display. The first insulating layer 131 is disposed between the semiconductor active layer 121 and the first gate electrode layer 122, the second insulating layer 132 is disposed between the first gate electrode layer 122 and the second gate electrode layer 123, and the third insulating layer 133 is disposed between the second gate electrode layer 123 and the source and drain electrode layer 124. The first insulating layer 131, the second insulating layer 132, and the third insulating layer 133 are configured to isolate two conductive layers adjacent thereto, respectively. The planarization layer 140 is disposed on the source and drain electrode layer 124 and is configured to planarize the array substrate to provide a flat base for manufacturing the light-emitting functional layer 200 on the planarization layer 140. A material of the planarization layer 140 is generally organic layers, which includes, but is not limited to, acrylates, polyimide (PI), or benzocyclobutene (BCB). The array substrate 100 may also be other structure that is familiar to the skilled person in the art, a structure of the array substrate mentioned above is only used to illustrate a structure of the display panel provided in the embodiment of the present disclosure, and is not limited to this.

In an embodiment, the substrate 110 includes a first substrate 111 in the first display area 11 and a second substrate 112 in the second display area 12, and the first substrate 111 and the second substrate 112 are disposed in a same layer and have a same thickness. In an embodiment, materials of the first substrate 111 and the second substrate 112 are same, and the first substrate 111 and the second substrate 112 are manufactured by a same process. The first substrate 111 and the second substrate 112 are transparent substrates, and both may be transparent rigid substrates such as highly transparent glass or may be transparent flexible substrates such as transparent polyimide (colorless polyimide, CPI) thin films. In another embodiment, the materials of the first substrate 111 and the second substrate 112 are different. The first substrate 111 is a transparent substrate, which may be a transparent rigid substrate such as highly transparent glass or may be a transparent flexible substrate such as a transparent polyimide (colorless polyimide, CPI) thin film, and the second substrate 112 is a non-transparent substrate or a substrate having very low transparency, such as a yellow polyimide (YPI) thin film or glass having low transparency.

This embodiment improves the light transmittance in the first display area 11 of the display panel by setting the first substrate 111 in the first display area 11 to be the transparent substrate. Therefore, the light transmittance in the light-transmitting areas TA of the display panel can be further improved, thereby improving the image-taking effect of the under-screen cameras.

Wherein, the light-emitting functional layer 200 includes a first electrode layer 210, a pixel definition layer 220, a first luminous auxiliary layer 230, a light-emitting material layer 240, a second luminous auxiliary layer 250, and a second electrode layer 260 disposed in a stack from bottom to top. Wherein, the first electrode layer 210 is disposed on the planarization layer 140 and is patterned to form first electrodes 210 that are disposed at intervals and are independent of each other. In the first display area 11, each of the first electrodes 210 is disposed in a corresponding first pixel area AA, and in the second display area 12, each of the first electrodes 210 is disposed in a corresponding second pixel area BA. The first electrodes 210 are connected to the source electrodes or the drain electrodes of the thin film transistors below by penetrating through through-holes of the planarization layer 140, thereby connecting to the driving circuits of the display panel. The pixel definition layer 220 is disposed on the first electrode layer 210 and is patterned to form openings of the pixel definition layer. In the first display area 11, the openings are defined in the first pixel areas AA, correspond to the first electrodes 210 by one to one, and expose the first electrodes 210, and in the second display area 12, the openings are defined in the second pixel areas BA, correspond to the first electrodes 210 by one to one, and expose the first electrodes 210. The first luminous auxiliary layer 230 is disposed on the pixel definition layer 220 as a whole layer and covers the pixel definition layer 220 and the first electrodes 210. The first luminous auxiliary layer 230 usually includes a hole transport layer and a hole injection layer, and the hole injection layer is disposed between the hole transport layer and the light-emitting material layer 240. The light-emitting material layer 240 is disposed in the openings of the pixel definition layer 220 and corresponds to the first electrodes 210 under the openings by one to one. The light-emitting material layer 240 includes first light-emitting material layers 241, second light-emitting material layers 242, and third light-emitting material layers 243 that have different colors, the first light-emitting material layers 241, the second light-emitting material layers 242, and the third light-emitting material layers 243 are disposed in a same layer and are respectively positioned in different pixel openings, and the first light-emitting material layers 241, the second light-emitting material layers 242, and the third light-emitting material layers 243 may be red light-emitting material layers, green light-emitting material layers, and blue light-emitting material layers, respectively. The second luminous auxiliary layer 250 is disposed on the light-emitting material layer 240 and covers the light-emitting material layer 240 and the first luminous auxiliary layer 230. The second luminous auxiliary layer 250 usually includes an electron transport layer and an electron injection layer, and the electron injection layer is disposed between the electron transport layer and the light-emitting material layer 240. The second electrode layer 260 is disposed on the second luminous auxiliary layer 250, and is usually a conductive layer formed by a non-transparent metal. A material of the second electrode layer 260 includes, but is not limited to, metals, such as silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca), and alloys thereof. The red light-emitting material layers, the first electrode layer 210 and the first luminous auxiliary layer 230 positioned under the red light-emitting material layers, and the second luminous auxiliary layer 250 and the second electrode layer 260 positioned on the red light-emitting material layers together constitute the red pixel light-emitting units. The green light-emitting material layers, the first electrode layer 210 and the first luminous auxiliary layer 230 positioned under the green light-emitting material layers, and the second luminous auxiliary layer 250 and the second electrode layer 260 positioned on the green light-emitting material layers together constitute the green pixel light-emitting units. The blue light-emitting material layers, the first electrode layer 210 and the first luminous auxiliary layer 230 positioned under the blue light-emitting material layers, and the second luminous auxiliary layer 250 and the second electrode layer 260 positioned on the blue light-emitting material layers together constitute the blue pixel light-emitting units.

In an embodiment, as shown in FIG. 2, in the second display area 12, the second electrode layer 260 is disposed as a whole layer, that is, the second electrode layer 260 completely covers the second luminous auxiliary layer 250 in the second display area 12. In the first display area 11, the second electrode layer 260 is defined with openings of the second electrode layer at positions corresponding to the gaps among the light-filtering units, that is, no second electrode layer 260 is disposed in the light-transmitting areas TA. A distance from edges of the openings of the second electrode layer to edges of the light-transmitting areas TA ranges from 0 to 5 μm. Each opening area of the second electrode layer 260 is greater than or equal to an area of each of the light-transmitting areas TA, that is, no second electrode layer 260 is disposed in whole light-transmitting areas TA; or each opening area of the second electrode layer 260 is less than the area of each of the light-transmitting areas TA, that is, a part of each of the light-transmitting areas TA is not provided with the second electrode layer 260.

In the first display area 11, this embodiment defines the openings of the second electrode layer at the positions of the second electrode layer 260 that correspond to the gaps among the light-filtering units, and further, a projection of the openings of the second electrode layer on the color filter layer 500 falls within a plane range of the gaps among the first light-filtering units. Thus, in the light-transmitting areas TA, no black matrix layer is disposed and only the transparent planarization layer 530 is retained in the color filter layer 500 that is positioned in an upper layer, and no second electrode layer is disposed and only the pixel definition layer 220, the first luminous auxiliary layer 230, and the second luminous auxiliary layer 250 that are transparent are retained in the light-emitting functional layer 200 that is positioned in a lower layer, thereby preventing a black light-shielding layer or a metal reflective layer from shielding light and further improving the light transmittance in the light-transmitting areas TA of the display panel. Therefore, it is beneficial to improve the image-taking effect of the under-screen cameras. In addition, this embodiment prevents uneven brightness of the display panel caused by the second electrode layer reflecting external ambient light due to no black matrix layer being disposed in the gaps among the light-filtering units by defining openings of the second electrode layer at the positions of the second electrode layer 260 that correspond to the gaps among the light-filtering units.

Wherein, the encapsulation layer 300 is disposed on the second electrode layer 260. The encapsulation layer 300 generally includes a first organic encapsulation layer, a second organic encapsulation layer, and an inorganic encapsulation layer disposed between the first organic encapsulation layer and the second organic encapsulation layer. The first organic encapsulation layer and the second organic encapsulation layer are configured to planarize the light-emitting functional layer and improve flexibility of the display panel, and the inorganic encapsulation layer is configured to isolate external water and oxygen or impure ions from entering the light-emitting functional layer. Wherein, the first organic encapsulation layer is disposed on the second electrode layer 260, fills openings of the pixel definition layer 220 and the openings of the second electrode layer 26, and covers the second electrode layer 260 and the second luminous auxiliary layer 250. The inorganic encapsulation layer is disposed on the first organic encapsulation layer as a whole layer, and the second organic encapsulation layer is disposed on the inorganic encapsulation layer as a whole layer.

Wherein, the touch control layer 400 is disposed on the encapsulation layer 300 and includes touch control electrodes 410. The touch control electrodes 410 may be self-capacitive touch control electrodes or mutual-capacitive touch control electrodes. The touch control electrodes 410 may be touch control electrodes constituted by a single metal layer or two metal layers. The touch control electrodes 410 may be mesh-shaped metal electrodes or flat metal electrodes. A specific structure of the touch control electrodes in the embodiments of the present disclosure is not limited.

In an embodiment, as shown in FIG. 2, the touch control electrodes 410 are disposed in the second display area 12, and there is no touch control electrode 410 in the first display area 11. The touch control electrodes commonly used in current technology are mesh-shaped metal electrode structures, and mesh lines of the touch control electrodes are positioned in interval areas among pixel areas, so in the first display area 11, the mesh lines of the touch control electrodes will shield light from transmitting through the light-transmitting areas TA, thereby reducing the light transmittance in the light-transmitting areas TA of the display panel. This embodiment prevents the touch control electrodes from shielding light that transmits through the light-transmitting areas TA by removing the touch control electrodes in the first display area 11. Thus, in the light-transmitting areas TA, no black matrix layer is disposed and only the transparent planarization layer 530 is retained in the color filter layer 500 that is positioned in an upper layer, no touch control electrode is disposed in the touch control layer 400 that is positioned in a middle layer, and no second electrode layer is disposed and only the pixel definition layer 220, the first luminous auxiliary layer 230, and the second luminous auxiliary layer 250 that are transparent are retained in the light-emitting functional layer 200 that is positioned in a lower layer, thereby preventing the black light-shielding layer or the metal reflective layer from shielding light and further improving the light transmittance in the light-transmitting areas TA of the display panel. Therefore, it is beneficial to improve the image-taking effect of the under-screen cameras. In addition, this embodiment prevents uneven brightness of the display panel caused by the touch control electrodes reflecting the external ambient light due to no black matrix layer being disposed in the gaps among the light-filtering units by removing the touch control electrodes in the first display area 11.

Wherein, the coverplate 600 is disposed on the color filter layer 500 and includes a transparent substrate 610 and an anti-reflection film 620. The transparent substrate 610 is disposed on the color filter layer 500, and the anti-reflection film 620 is disposed on the transparent substrate 610 and is positioned in the first display area 11. The anti-reflection film 620 is a coating layer, film, or glass that has anti-reflection properties. The anti-reflection film 620 is a single-layered structure, a double-layered structure, or a multi-layered structure having three or more than three layers, and specifically includes, but is not limited to, a single-layered magnesium fluoride thin film, a double-layered magnesium fluoride/zirconia thin film, or a multi-layered silicon oxide/titanium oxide/silicon oxide/titanium oxide thin film. In one aspect, in the first display area 11, the color filter layer 500 only includes the light-filtering units and the transparent planarization layer 530, and lacks the black matrix layer 510, so the display panel reduces reflections to ambient light only by the light-filtering units. Therefore, an anti-reflection effect of the first display area 11 on the ambient light is lower than an anti-reflection effect of the second display area 12 on the ambient light. In another aspect, the transparent substrate 610 has a very strong reflection effect on external light due to its mirror effect, so the light transmittance of the display panel will be greatly reduced. Therefore, this embodiment of the present disclosure disposes the anti-reflection film 620 on one side of the transparent substrate 610 away from the color filter layer 500 in the first display area 11, thereby reducing reflections of the display panel to the ambient light in the first display area 11 by an anti-reflection effect of the anti-reflection film 620 and improving the light transmittance in the first display area 11 of the display panel. Meanwhile, the anti-reflection effect of the anti-reflection film 620 further improves the light transmittance in the first display area 11 of the display panel, thereby improving the light transmittance in the light-transmitting areas TA of the display panel and further improving the image-taking effect of the under-screen cameras.

Correspondingly, an embodiment of the present disclosure further provides a display device, which includes any one of the display panels provided in the embodiments of the present disclosure and has technical features and technical effects of the display panels. For specific implementation and working principles, please refer to the specific embodiments mentioned above, and they will not be repeated here.

In summary, the embodiments of the present disclosure provide the display panel and the display device. The display panel prevents the black matrix layer from shielding the light-transmitting areas by removing the black matrix layer in the first display area and adopting the transparent filling layer to fill the light-transmitting areas among the light-filtering units, thereby greatly improving the light transmittance in the light-transmitting areas of the display panel and thus, improving the image-taking effect of the under-screen cameras. Further, the anti-reflection film is disposed on the coverplate in the first display area of the display panel, thereby reducing the reflections of the display panel to the ambient light in the first display area by the anti-reflection effect of the anti-reflection film and improving the light transmittance in the first display area of the display panel. The anti-reflection effect of the anti-reflection film further improves the light transmittance in the first display area of the display panel, thereby improving the light transmittance in the light-transmitting areas of the display panel and further improving the image-taking effect of the under-screen cameras. Further, the display panel prevents the touch control electrodes from shielding the light-transmitting areas by removing the touch control electrodes in the first display area, thereby further improving the light transmittance in the light-transmitting areas of the display panel and improving the image-taking effect of the under-screen cameras. Further, the display panel defines the openings on the second electrode layer at positions corresponding to the light-transmitting areas, and no second electrode layer is disposed in the openings, thereby further improving the light transmittance in the light-transmitting areas of the display panel and improving the image-taking effect of the under-screen cameras. Further, the first substrate in the first display area of the display panel is set to be the transparent substrate, thereby further improving the light transmittance in the light-transmitting areas of the display panel and improving the image-taking effect of the under-screen cameras.

The display panel and the display device provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display panel, comprising a first display area and a second display area, wherein a light transmittance of the first display area is greater than a light transmittance of the second display area; wherein the display panel comprises a light-emitting functional layer and a color filter layer, and the light-emitting functional layer comprises a plurality of pixel light-emitting units disposed at intervals; and in the first display area, the color filter layer comprises a first light-filtering layer and a first transparent planarization layer, the first light-filtering layer comprises a plurality of first light-filtering units corresponding to the pixel light-emitting units by one to one, and the first transparent planarization layer fills gaps among the first light-filtering units adjacent to each other, wherein the light-emitting functional layer comprises a first electrode layer, a light-emitting layer, and a second electrode layer, the light-emitting layer is disposed between the first electrode layer and the second electrode layer, the first electrode layer comprises a plurality of first electrodes disposed at intervals and independent of each other, and the first electrodes correspond to the pixel light-emitting units; and in the first display area, openings of the second electrode layer are defined on the second electrode layer corresponding to the gaps among the first light-filtering units.

2. The display panel according to claim 1, wherein in the second display area, the color filter layer comprises a black matrix layer, a second light-filtering layer, and a second transparent planarization layer, the black matrix layer is patterned to form black matrix openings, the second light-filtering layer comprises a plurality of second light-filtering units disposed in the black matrix openings and corresponding to the pixel light-emitting units by one to one, and the second transparent planarization layer covers the second light-filtering layer and the black matrix layer.

3. The display panel according to claim 2, wherein an orthographic projection of the first light-filtering units on the light-emitting functional layer covers the pixel light-emitting units corresponding to the first light-filtering units, and an orthographic projection of the second light-filtering units on the light-emitting functional layer covers the pixel light-emitting units corresponding to the second light-filtering units.

4. The display panel according to claim 3, wherein for the pixel light-emitting units having a same color, a size of the pixel light-emitting units in the first display area is less than a size of the pixel light-emitting units in the second display area, and for the first light-filtering units and the second light-filtering units corresponding to the pixel light-emitting units having the same color, a size of the first light-filtering units is less than a size of the second light-filtering units.

5. The display panel according to claim 1, wherein a projection of the openings of the second electrode layer on the color filter layer is within a plane range of the gaps among the first light-filtering units.

6. The display panel according to claim 1, wherein in the second display area, the second electrode layer is disposed as a whole layer.

7. The display panel according to claim 2, further comprising a touch control layer disposed between the color filter layer and the light-emitting functional layer, wherein the touch control layer comprises touch control electrodes disposed in an area outside the first display area.

8. The display panel according to claim 7, wherein in the second display area, the touch control electrodes are disposed at positions corresponding to the black matrix layer.

9. The display panel according to claim 1, further comprising a coverplate disposed on one side of the color filter layer away from the light-emitting functional layer, wherein in the first display area, the coverplate comprises a transparent substrate and an anti-reflection film disposed on one side of the transparent substrate away from the color filter layer.

10. The display panel according to claim 9, wherein the anti-reflection film comprises a transparent film layer having a single-layered structure or a multi-layered transparent film layer having different refractive indexes.

11. The display panel according to claim 10, wherein the anti-reflection film comprises a single-layered magnesium fluoride thin film, a double-layered magnesium fluoride/zirconia thin film, or a multi-layered silicon oxide/titanium oxide/silicon oxide/titanium oxide thin film.

12. The display panel according to claim 1, further comprising an array substrate, wherein the array substrate comprises a substrate, and in the first display area, the substrate is a transparent substrate.

13. The display panel according to claim 12, wherein the transparent substrate is highly transparent glass or a transparent polyimide thin film.

14. A display device, comprising a display panel, wherein the display panel comprises a first display area and a second display area, and a light transmittance of the first display area is greater than a light transmittance of the second display area; the display panel comprises a light-emitting functional layer and a color filter layer, and the light-emitting functional layer comprises a plurality of pixel light-emitting units disposed at intervals; and in the first display area, the color filter layer comprises a first light-filtering layer and a first transparent planarization layer, the first light-filtering layer comprises a plurality of first light-filtering units corresponding to the pixel light-emitting units by one to one, and the first transparent planarization layer fills gaps among the first light-filtering units adjacent to each other wherein the light-emitting functional layer comprises a first electrode layer, a light-emitting layer, and a second electrode layer, the light-emitting layer is disposed between the first electrode layer and the second electrode layer, the first electrode layer comprises a plurality of first electrodes disposed at intervals and independent of each other, and the first electrodes correspond to the pixel light-emitting units; and in the first display area, openings of the second electrode layer are defined on the second electrode layer corresponding to the gaps among the first light-filtering units.

15. The display device according to claim 14, wherein in the second display area, the color filter layer comprises a black matrix layer, a second light-filtering layer, and a second transparent planarization layer, the black matrix layer is patterned to form black matrix openings, the second light-filtering layer comprises a plurality of second light-filtering units disposed in the black matrix openings and corresponding to the pixel light-emitting units by one to one, and the second transparent planarization layer covers the second light-filtering layer and the black matrix layer.

16. The display device according to claim 14, wherein the display panel further comprises a touch control layer disposed between the color filter layer and the light-emitting functional layer, and the touch control layer comprises touch control electrodes disposed in an area outside the first display area.

17. The display device according to claim 14, wherein the display panel further comprises a coverplate disposed on one side of the color filter layer away from the light-emitting functional layer, and in the first display area, the coverplate comprises a transparent substrate and an anti-reflection film disposed on one side of the transparent substrate away from the color filter layer.

18. The display device according to claim 14, wherein the display panel further comprises an array substrate, the array substrate comprises a substrate, and in the first display area, the substrate is a transparent substrate.

\* \* \* \* \*